United States Patent
Ahn

(10) Patent No.: US 10,497,665 B2
(45) Date of Patent: *Dec. 3, 2019

(54) APPARATUS FOR LASER BONDING OF FLIP CHIP AND METHOD FOR LASER BONDING OF FLIP CHIP

(71) Applicant: PROTEC CO., LTD., Gyeonggi-do (KR)

(72) Inventor: Geunsik Ahn, Seoul (KR)

(73) Assignee: PROTEC CO., LTD., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/011,649

(22) Filed: Jun. 19, 2018

(65) Prior Publication Data

US 2018/0366435 A1    Dec. 20, 2018

(30) Foreign Application Priority Data

Jun. 20, 2017  (KR) .................. 10-2017-0077721

(51) Int. Cl.
| | | |
|---|---|---|
| *H01L 21/30* | (2006.01) | |
| *H01L 21/46* | (2006.01) | |
| *H01L 23/00* | (2006.01) | |
| *B23K 1/005* | (2006.01) | |

(52) U.S. Cl.
CPC ............ *H01L 24/75* (2013.01); *B23K 1/0056* (2013.01); *H01L 24/17* (2013.01); *H01L 24/742* (2013.01); *H01L 24/81* (2013.01); *H01L 2224/753* (2013.01); *H01L 2224/75261* (2013.01); *H01L 2224/81224* (2013.01); *H01L 2224/83203* (2013.01)

(58) Field of Classification Search
CPC ........ H01L 24/742; H01L 24/11; H01L 24/17; H01L 24/75; H01L 24/81; H01L 2/83; H01L 24/92; H01L 25/50
USPC .......................................... 438/455
See application file for complete search history.

(56) References Cited

U.S. PATENT DOCUMENTS

| | | |
|---|---|---|
| 6,394,158 B1 | 5/2002 | Momeni |
| 2007/0037318 A1* | 2/2007 | Kim .................. B23K 26/0643 438/106 |
| 2016/0049381 A1 | 2/2016 | Ryu et al. |

FOREIGN PATENT DOCUMENTS

| | | |
|---|---|---|
| JP | 2001148403 | 5/2001 |
| KR | 1020050090089 | 9/2005 |
| KR | 20080101329 A * | 11/2008 |
| KR | 1020080101329 | 11/2008 |

(Continued)

OTHER PUBLICATIONS

Office Action of Taiwan Counterpart Application, dated Nov. 7, 2018, pp. 1-7.

*Primary Examiner* — David S Blum
(74) *Attorney, Agent, or Firm* — JCIPRNET

(57) ABSTRACT

Provided are a flip chip laser bonding apparatus and a flip chip laser bonding method, and more particularly, to an apparatus and method for flip chip laser bonding, in which a semiconductor chip in a flip chip form is bonded to a substrate by using a laser beam. According to the flip chip laser bonding apparatus and the flip chip laser bonding method, even a semiconductor chip that is bent or is likely to bend may also be bonded to a substrate without contact failure of solder bumps by bonding the semiconductor chip to the substrate by laser bonding while pressurizing the semiconductor chip.

14 Claims, 4 Drawing Sheets

(56) References Cited

FOREIGN PATENT DOCUMENTS

| TW | 200428625 | 12/2004 |
|----|-----------|---------|
| TW | 200525667 | 8/2005 |
| TW | 201031297 | 8/2010 |
| TW | 201344819 | 11/2013 |
| TW | 201401392 | 1/2014 |
| TW | 201401401 | 1/2014 |

* cited by examiner

APPARATUS FOR LASER BONDING OF FLIP CHIP AND METHOD FOR LASER BONDING OF FLIP CHIP

CROSS-REFERENCE TO RELATED APPLICATION(S)

This application is based on and claims priority under 35 U.S.C. § 119 to Korean Patent Application No. 10-2017-0077721, filed on Jun. 20, 2017, in the Korean Intellectual Property Office, the disclosure of which is incorporated by reference herein in its entirety.

BACKGROUND

1. Field

One or more embodiments relate to an apparatus and method for flip chip laser bonding, and more particularly, to an apparatus and method for flip chip laser bonding in which a semiconductor chip in a flip chip form is bonded to a substrate by using a laser beam.

2. Description of Related Art

As electronic products are becoming compact, a semiconductor chip in a flip-chip form in which no wire bonding is used is widely used. A semiconductor chip in the form of a flip chip includes a plurality of electrodes in the form of solder bumps on a lower surface of the semiconductor chip, and the semiconductor chip is bonded to a substrate by bonding the electrodes to locations corresponding to those solder bumps which are also formed on the substrate.

Examples of a method of mounting a semiconductor chip on a substrate by a flip chip method as described above include a reflow method and a laser bonding method. In the reflow method, a semiconductor chip is bonded to a substrate after disposing the semiconductor chip having solder bumps coated with a flux and passing the substrate through a high-temperature reflow. According to the laser bonding method, a semiconductor chip including solder bumps coated with a flux is disposed on a substrate like in the reflow method, and the semiconductor chip is irradiated with a laser beam to transfer energy to the solder bumps so that the solder bumps are instantaneously melted and then hardened, thereby bonding the semiconductor chip to the substrate.

Flip chip type semiconductor chips have been recently decreased in thickness to several hundreds of micrometers or less. A semiconductor chip having such a small thickness may slightly be bent or warped due to an internal stress of the semiconductor chip itself. When a semiconductor chip is deformed as above, the semiconductor chip may be bonded while some of solder bumps of the semiconductor chip are not in contact with corresponding solder bumps of the substrate. This causes a defect in a semiconductor chip bonding process. Further, when temperatures of the semiconductor chip and a substrate rise instantaneously together with a temperature of solder bumps as a laser beam is irradiated to the semiconductor chip, the semiconductor chip or the substrate may be partially bent or warped due to a difference in coefficients of thermal expansion of materials of the semiconductor chip and the substrate, and this also causes a defect in the semiconductor chip bonding process.

SUMMARY

One or more embodiments include apparatuses and methods for flip chip laser bonding, in which a semiconductor chip may be effectively bonded to a substrate while preventing poor contact of solder bumps of the semiconductor chip due to an already bent or warped semiconductor chip or due to a semiconductor chip that may be bent or warped because of a temperature rise.

Additional aspects will be set forth in part in the description which follows and, in part, will be apparent from the description, or may be learned by practice of the presented embodiments.

According to one or more embodiments, a flip chip laser bonding apparatus includes: a fixing member configured to fix a lower surface of a substrate, wherein a plurality of semiconductor chips to be bonded to an upper surface of the substrate are arranged on the substrate; a pressing member arranged above the fixing member, the pressing member including a transparent portion through which a laser beam penetrates; a lifting member configured to lift or lower one of the fixing member and the pressing member relative to the other of the fixing member and the pressing member such that at least some of the plurality of semiconductor chips (pressurized semiconductor chips) are pressurized against the substrate; and a laser head configured to irradiate the laser beam to the pressurized semiconductor chips between the pressing member and the fixing member through the transparent portion of the pressing member so as to bond solder bumps of the semiconductor chips and solder bumps of the substrate to each other.

According to one or more embodiments, a flip chip laser bonding method includes: (a) disposing a plurality of semiconductor chips on an upper surface of a substrate according to bonding locations on the substrate where the semiconductor chips are to be bonded; (b) fixing a lower surface of the substrate, on which the plurality of semiconductor chips are disposed, to the fixing member; (c) pressurizing at least some of the plurality of semiconductor chips (pressurized semiconductor chips) against the substrate by lifting or lowering one of the pressing member and the fixing member relative to the other of the pressing member and the fixing member by using a lifting member, wherein the pressing member is disposed above the fixing member and includes a transparent portion through which a laser beam penetrates; and (d) irradiating a laser beam to the pressurized semiconductor chips between the pressing member and the fixing member through the transparent portion of the pressing member, by using the laser head, so as to bond solder bumps of the semiconductor chips and solder bumps of the substrate to each other.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION

Hereinafter, a flip chip laser bonding apparatus according to an embodiment of the present disclosure will be described in detail with reference to the attached drawings.

Figure 1:
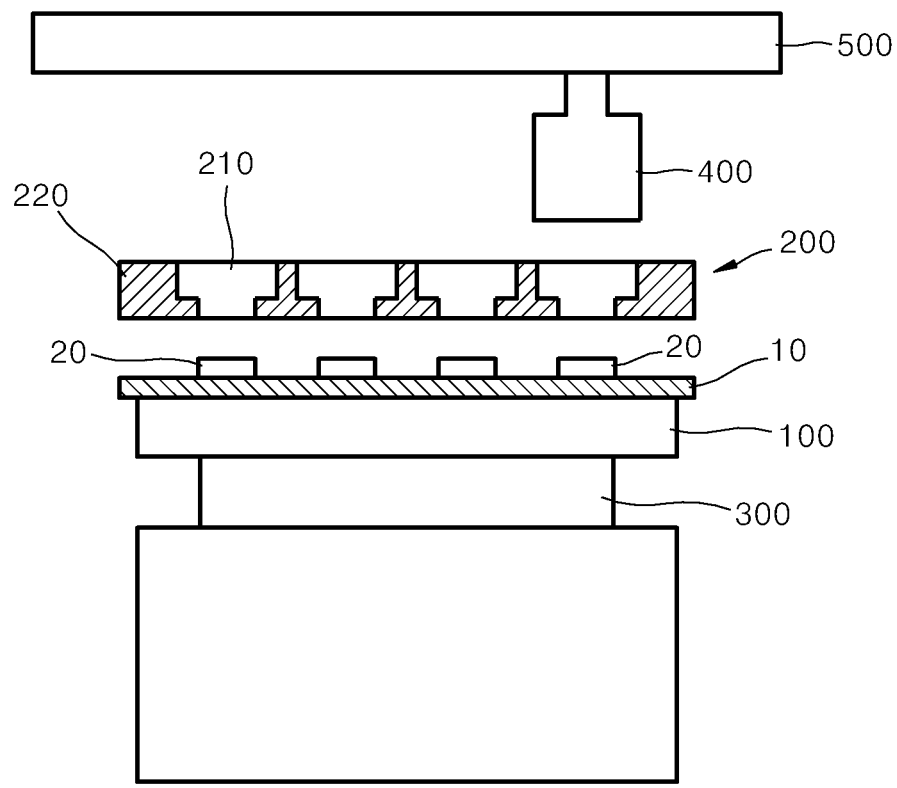
FIG. 1 is a conceptual diagram of a flip chip laser bonding apparatus according to an embodiment of the present disclosure.
Figure 2:
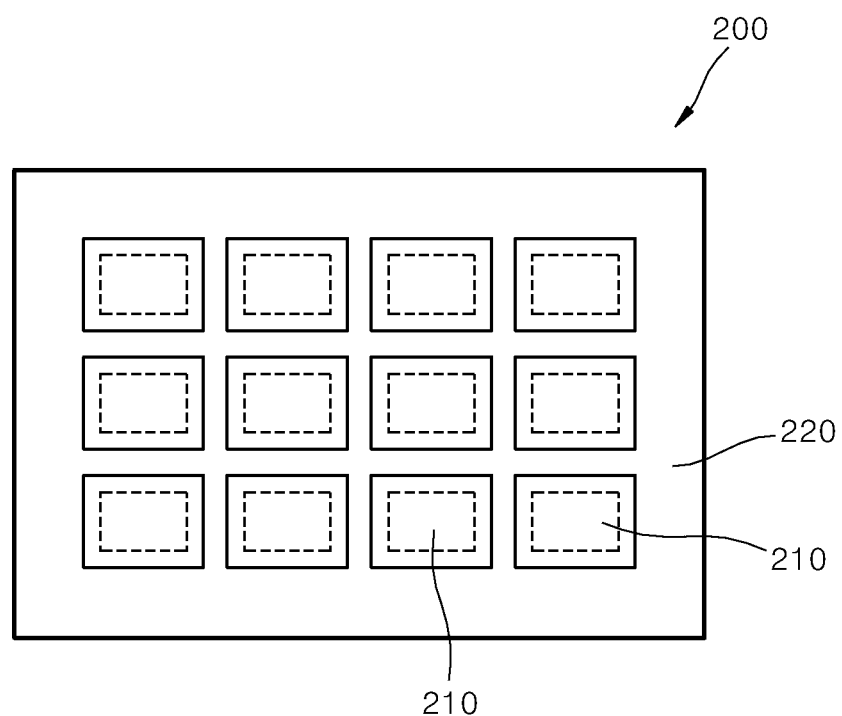
FIG. 2 is a plan view of a pressing member of the flip chip laser bonding apparatus illustrated in FIG. 1.

FIG. 1 is a conceptual diagram of a flip chip laser bonding apparatus according to an embodiment of the present disclosure, and FIG. 2 is a plan view of a pressing member 200 of the flip chip laser bonding apparatus illustrated in FIG. 1.

The flip chip laser bonding apparatus according to the present embodiment is an apparatus for bonding a semiconductor chip 20 to a substrate 10 in a flip chip form by using a laser beam. Solder bumps 11 and 21 are respectively formed on the substrate 10 and the semiconductor chip 20, and as the solder bumps 11 and 21 are instantaneously melted by an energy transferred by the laser beam and then hardened, the semiconductor chip 20 is bonded to the substrate 10.

Referring to FIGS. 1 and 2, the flip chip laser bonding apparatus according to the present embodiment includes a fixing member 100, the pressing member 200, a lifting member 300, and a laser head 400.

The fixing member 100 fixes the substrate 10 on which the semiconductor chips 20 to be bonded to the substrate 10 are disposed on the substrate 10. The fixing member 100 according to the present embodiment fixes the substrate 10 by supporting a lower surface of the substrate 10 by using a vacuum absorption method. The substrate 10 on which the semiconductor chips 20 are arranged at exact locations corresponding to locations where the solder bumps 11 are formed is supplied to the fixing member 100, and is adsorbed and fixed by the fixing member 100. The semiconductor chips 20 are disposed on the substrate 10 after a flux is coated on the solder bumps 21 formed on the lower surface of the semiconductor chips 20. The semiconductor chips 20 are then temporarily adhered to the substrate 10 via viscosity or adhesive characteristics of the flux. Unless a relatively large amount of vibration or a relatively great external force is applied, the semiconductor chips 20 arranged on the substrate 10 are not shaken by operation of the flux but are maintained at their locations.

The pressing member 200 is disposed above the fixing member 100. The pressing member 200 includes a transparent portion 210 and a mask portion 220. The transparent portion 210 may be formed of a transparent material through which a laser beam transmits. Quartz which is widely used to transmit a laser beam may be used as a material of the transparent portion 210. The mask portion 220 may be formed of an opaque material through which a laser beam cannot penetrate. The mask portion 220 is configured to support the transparent portion 210. The transparent portion 210 may be disposed in areas to respectively correspond to the semiconductor chips 20 of the substrate 10 in a one-on-one manner, wherein the substrate 10 is fixed by using the fixing member 100 below the transparent portions 210, and the mask portion 220 is configured to support the transparent portions 210 in a planar manner. In addition, as described above, the mask portion 220 may be formed of an opaque material to prevent a laser beam from passing through regions other than the transparent portions 210. A lower surface of the transparent portions 210 is planar. When pressing the semiconductor chips 20 by using the pressing member 200 via operation of the lifting member 300, which will be described later, the semiconductor chips 20 are pressurized uniformly and flatly via the transparent portions 210 having a flat lower surface.

The lifting member 300 performs a function of vertically lifting up and down the fixing member 100. While the substrate 10 is adsorbed by and fixed to the fixing member 100, the lifting member 300 lifts up the fixing member 100 to closely contact with the fixing member 100 to the pressing member 200, thereby pressurizing the semiconductor chips 20. Hereinafter, the semiconductor chips 20 pressed between the fixing member 100 and the pressing member 200 via operation of the lifting member 300 will be referred to as 'pressurized semiconductor chips 20.'

The laser head 400 is disposed above the pressing member 200. The laser head 400 generates a laser beam and transmits the laser beam to the semiconductor chips 20 below the transparent portions 210 of the pressing member 200 through the transparent portions 210 of the pressing member 200. As the solder bumps 11 of the substrate 10 and the solder bumps 21 of the semiconductor chips 20 are instantaneously melted by an energy transferred by the laser beam, the semiconductor chips 20 are bonded to the substrate 10.

The laser head 400 is mounted on a head transporting member 500. The head transporting member 500 transports the laser head 400 in a horizontal direction. From above the pressing member 200, the laser head 400 may simultaneously irradiate a laser beam to a plurality of transparent portions 210 or may sequentially irradiate a laser beam to each of the transparent portions 210. The head transporting member 500 transports the laser head 400 to a location where a laser beam is to be irradiated.

Hereinafter, a flip chip laser bonding method for bonding the semiconductor chips 20 to the substrate 10 by using the flip chip laser bonding apparatus according to the present embodiment configured as described above will be described.

First, the semiconductor chips 20 are disposed on an upper surface of the substrate 10 according to bonding locations on the substrate 10 where the semiconductor chips 20 are to be bonded (step (a)). The semiconductor chips 20 are arranged on corresponding locations on the substrate 10 by coating the solder bumps 21 of the semiconductor chips 20 with a flux by dipping the solder bumps 21 formed on a lower surface of the semiconductor chips 20, into a flux, or by applying a flux to the solder bumps 21. Here, the solder bumps 11 of the substrate 10 and the solder bumps 21 of the semiconductor chips 20 face each other to be connected to each other. As described above, the semiconductor chips 20 are now temporarily adhered to the upper surface of the substrate 10 via viscosity or an adhesive force of the flux.

Figure 3:
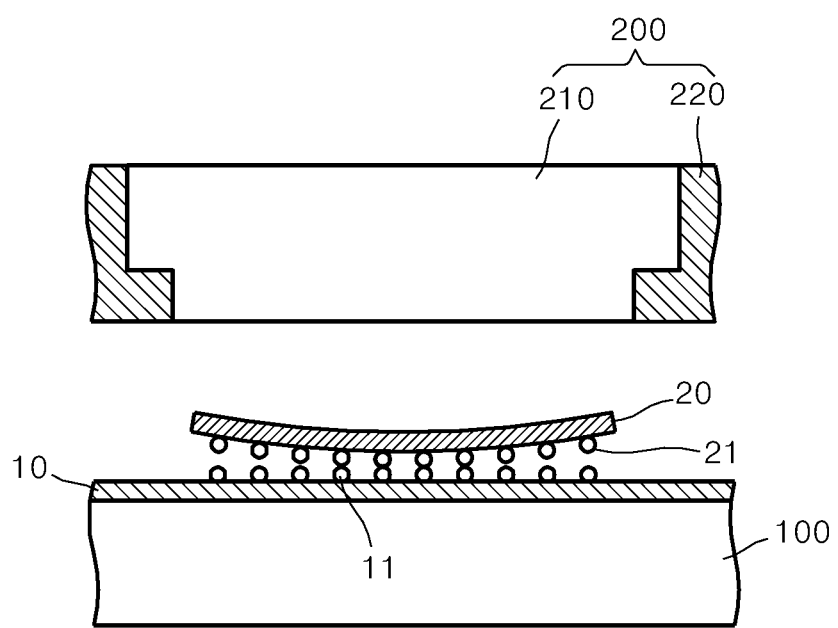
FIGS. 3 and 4 are cross-sectional views for describing an operation of the flip chip laser bonding apparatus illustrated in FIG. 1.

Next, the substrate 10 on which the semiconductor chips 20 are disposed is disposed on the fixing member 100 such that the lower surface of the substrate 10 is fixed via the fixing member 100 (step (b)). The fixing member 100 fixes the substrate 10 by adsorbing the lower surface of the substrate 10 by using a vacuum adsorption method. Here, when the semiconductor chips 20 are very thin and have internal stress, the semiconductor chips 20 may be warped or bent as illustrated in FIG. 3.

Figure 4:
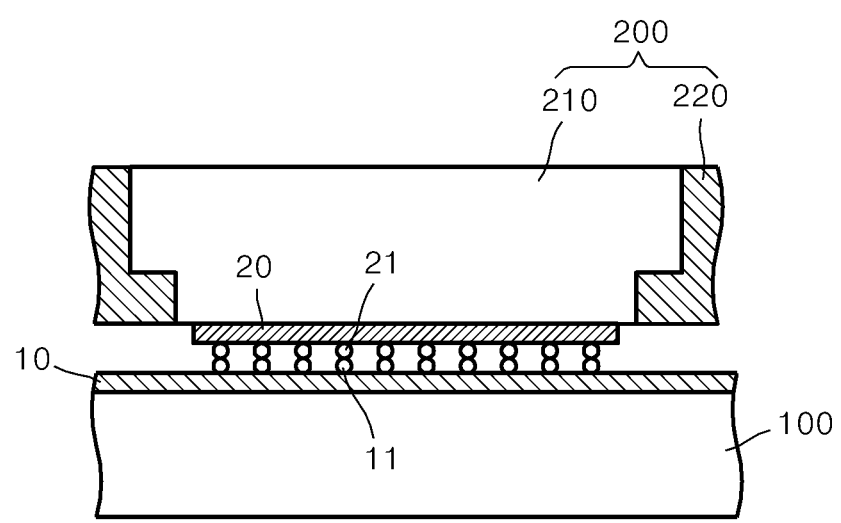

While the substrate 10 is fixed to the fixing member 100 as described above, the semiconductor chips 20 are pressurized against the substrate 10 by closely contacting the semiconductor chips 20 to the pressing member 200 by lifting up the fixing member 100 by using the lifting member 300 (step (c)). As the substrate 10 and the semiconductor chips 20 are closely contacted to each other between the pressing member 200 and the fixing member 100 according to the operation of the lifting member 300, the semiconductor chips 20, which have been bent, are smoothed to face the substrate 10 as illustrated in FIG. 4.

In this state, the laser head 400 irradiates a laser beam to bond the solder bumps 21 of the semiconductor chips 20 and the solder bumps 11 of the substrate 10 to each other (step (d)). The laser beam irradiated from the laser head 400 is transmitted to the pressurized semiconductor chips 20 via the transparent portions 210 of the pressing member 200. As the solder bumps 11 and 21 of the substrate 10 and the pressurized semiconductor chips 20 are instantaneously melted by an energy transferred by the laser beam and then hardened, the semiconductor chips 20 are bonded to the substrate 10 as illustrated in FIG. 4. While thermal deformation may occur according to an instantaneous temperature rise of the semiconductor chips 20 or the substrate 10 due to the laser beam, since the transparent portions 210 of the pressing member 200 are pressing down the semiconductor chips 20, the semiconductor chips 20 are stably bonded to the substrate 10 while preventing warping or bending of the semiconductor chips 20 due to thermal deformation. In this manner, bonding defects of the solder bumps 11 and 21 may be prevented.

As described above, the pressing member 200 includes the transparent portions 210 and the mask portion 220, and a laser beam is configured to transmit only the transparent portions 210. Accordingly, a laser beam irradiated from the laser head 400 passes through the transparent portions 210 of the pressing member 200 and is transmitted only to the semiconductor chips 20 disposed under the transparent portions 210. By using the pressing member 200 including the transparent portions 210 and the mask portion 220 as described above, irradiation of a laser beam onto a portion of the substrate 10 where transfer of energy of the laser beam is not needed may be prevented.

In addition, step (d) may also be performed such that a plurality of semiconductor chips 20 are simultaneously bonded to the substrate 10 by using the pressing member 200 as described above. By increasing an irradiation area of a laser beam by operating the laser head 400, the laser beam may be irradiated onto two or more semiconductor chips 20 at the same time. As the mask portion 220 of the pressing member 200 prevents a laser beam from passing through an area other than regions corresponding to the semiconductor chips 20 as described above, even when the laser beam is irradiated onto a relatively broad area, energy of the laser beam may be transferred only to the semiconductor chips 20 which are to be bonded. By simultaneously bonding a plurality of semiconductor chips 20 to the substrate 10 by using the above-described method, an overall process productivity may be improved. According to circumstances, step (d) may also be performed such that all of the semiconductor chips 20 pressurized by using the pressing member 200 are simultaneously bonded to the substrate 10 by irradiating a laser beam to the entire pressing member 200 as illustrated in FIG. 2.

In addition, according to circumstances, step (d) may be performed by transporting the laser head 400 by using the head transporting member 500 described above. Step (d) may be performed such that each semiconductor chip 20 is sequentially bonded to the substrate 10 at a time by transporting the laser head 400 by using the head transporting member 500. Similarly, step (d) may be performed by bonding two semiconductor chips 20 to the substrate 10 at a time or by irradiating a laser beam to a row of semiconductor chips 20 at a time.

As described above, while the plurality of semiconductor chips 20 are simultaneously pressurized by using the pressing member 200, just a region to which a laser beam is to be irradiated may be modified by increasing or reducing the region for laser beam irradiation, and thus, according to the flip chip laser bonding apparatus and the flip chip laser bonding method of the present disclosure, a bonding operation of the semiconductor chips 20 may be quickly performed.

Meanwhile, even when not using the head transporting member 500, a bonding operation on one or a plurality of semiconductor chips 20 may be sequentially performed. While the laser head 400 is fixed, when a location and area of laser beam irradiation are configured to be adjusted optically according to an internal operation of the laser head 400, step (d) may be performed by sequentially irradiating a laser beam to the semiconductor chips 20 and also by using the flip chip laser bonding apparatus that includes the laser head 400 which is in a fixed state.

While the present disclosure has been described with reference to preferred embodiments, the scope of the present disclosure is not limited to the above-described and illustrated structures.

For example, while the lifting member 300 is described as lifting or lowering the fixing member 100, the flip chip laser bonding apparatus may also be configured such that the lifting member lifts or lowers the pressing member. In this case, step (c) is performed by pressurizing the semiconductor chips against the substrate as the lifting member lowers the pressing member while the substrate is fixed to the fixing member.

In addition, a pressurizing force of the pressurized semiconductor chips according to the pressing member may be configured to be adjusted by using the lifting member. A pressurizing force between the substrate and the semiconductor chips may also be adjusted by adjusting a rising pressure of the fixing member by using the lifting member while the pressing member is fixed or by adjusting a falling pressure that lowers the pressing member by using the lifting member while the fixing member is fixed.

In addition, while it is described above that all of the semiconductor chips 20 on the substrate 10 are pressurized by lifting up the fixing member 100 by using the lifting member 300 and a laser beam is irradiated simultaneously or sequentially to bond the semiconductor chips 20, the flip chip laser bonding apparatus may also be configured such that the semiconductor chips 20 on the substrate 10 are grouped into a preset number of groups and each group of the semiconductor chips 20 is sequentially pressurized by using the pressing member, and then bonded by using a laser head. In this case, the flip chip laser bonding apparatus according to the present disclosure further includes a fixing unit-transporting member that horizontally transports the fixing member. According to the flip chip laser bonding apparatus configured as described above, semiconductor chips are bonded to a substrate by repeatedly performing sequentially transporting the fixing member in a horizontal direction by using the fixing unit-transporting member, lifting the fixing member by using the lifting member to pressurize some of the groups of the semiconductor chips as pressurized semiconductor chips to be bonded, and then lowering the fixing member.

In addition, while the pressing member 200 is described above as including the transparent portions 210 and the mask portion 220, a pressing member without a mask portion may also be used. In this case, the entire main portion of the pressing member may be formed of a transparent portion and used to pressurize a plurality of semiconductor chips, and a laser beam may be irradiated to all of the plurality of semiconductor chips.

According to the flip chip laser bonding apparatus and the flip chip laser bonding method of the present disclosure, even a semiconductor chip that is bent or is likely to bend may also be bonded to a substrate without contact failure of solder bumps by bonding the semiconductor chip to the substrate by laser bonding while pressurizing the semiconductor chip.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A flip chip laser bonding apparatus, comprising:
   a fixing member configured to fix a lower surface of a substrate, wherein a plurality of semiconductor chips to be bonded to an upper surface of the substrate are arranged on the substrate;
   a pressing member arranged above the fixing member, the pressing member comprising a transparent portion through which a laser beam penetrates, wherein the pressing member further comprises a mask portion that is formed of an opaque material and supports the transparent portion;
   a lifting member configured to lift or lower one of the fixing member and the pressing member relative to the other of the fixing member and the pressing member such that at least some of the plurality of semiconductor chips that are pressurized are pressurized against the substrate; and
   a laser head configured to irradiate the laser beam to the pressurized semiconductor chips between the pressing member and the fixing member through the transparent portion of the pressing member so as to bond solder bumps of the semiconductor chips and solder bumps of the substrate to each other, wherein the transparent portion of the pressing member is disposed in areas corresponding to the pressurized semiconductor chips.

2. The flip chip laser bonding apparatus of claim 1, wherein the laser head sequentially irradiates a laser beam to each of the pressurized semiconductor chips.

3. The flip chip laser bonding apparatus of claim 1, wherein the laser head simultaneously irradiates a laser beam to at least two of the pressurized semiconductor chips.

4. The flip chip laser bonding apparatus of claim 1, wherein the laser head simultaneously irradiates a laser beam to all of the pressurized semiconductor chips.

5. The flip chip laser bonding apparatus of claim 2, further comprising a head transporting member configured to transport the laser head.

6. The flip chip laser bonding apparatus of claim 1, wherein the lifting member lifts or lowers the pressing member relative to the fixing member.

7. The flip chip laser bonding apparatus of claim 1, wherein the lifting member lifts or lowers the fixing member relative to the pressing member.

8. The flip chip laser bonding apparatus of claim 1, wherein the fixing member adsorbs the lower surface of the substrate to fix the lower surface of the substrate.

9. A flip chip laser bonding method, comprising:
   (a) disposing a plurality of semiconductor chips on an upper surface of a substrate according to bonding locations on the substrate where the semiconductor chips are to be bonded;
   (b) fixing a lower surface of the substrate, on which the plurality of semiconductor chips are disposed, to a fixing member;
   (c) pressurizing at least some of the plurality of semiconductor chips that are pressurized against the substrate by lifting or lowering one of a pressing member and the fixing member relative to the other of the pressing member and the fixing member by using a lifting member, wherein the pressing member is disposed above the fixing member and comprises a transparent portion through which a laser beam penetrates wherein (c) is performed by using the pressing member comprising the transparent portion disposed in areas corresponding to the pressurized semiconductor chips and a mask portion formed of an opaque material and supporting the transparent portion; and
   (d) irradiating a laser beam to the pressurized semiconductor chips between the pressing member and the fixing member through the transparent portion of the pressing member by using a laser head, so as to bond solder bumps of the semiconductor chips and solder bumps of the substrate to each other.

10. The flip chip laser bonding method of claim 9, wherein (d) is performed by sequentially irradiating a laser beam to each of the pressurized semiconductor chips by using the laser head.

11. The flip chip laser bonding method of claim 9, wherein (d) is performed by simultaneously irradiating a laser beam to at least two of the pressurized semiconductor chips by using the laser head.

12. The flip chip laser bonding method of claim 9, wherein (d) is performed by simultaneously irradiating a laser beam to all of the pressurized semiconductor chips by using the laser head.

13. The flip chip laser bonding method of claim 9, wherein (c) is performed as the lifting member lifts or lowers the pressing member relative to the fixing member.

14. The flip chip laser bonding method of claim 9, wherein (c) is performed as the lifting member lifts or lowers the fixing member relative to the pressing member.

* * * * *